United States Patent
Shao et al.

(10) Patent No.: US 6,962,769 B2
(45) Date of Patent: Nov. 8, 2005

(54) ANTI-REFLECTIVE COATING COMPOSITION WITH IMPROVED SPIN BOWL COMPATIBILITY

(75) Inventors: Xie Shao, Rolla, MO (US); Jim D. Meador, Ballwin, MO (US); Mandar Bhave, Rolla, MO (US); Vandana Krishnamurthy, Rolla, MO (US); Kelly A. Nowak, Rolla, MO (US); Michelle Fowler, Rolla, MO (US); Shreeram V. Deshpande, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 69 days.

(21) Appl. No.: 10/660,667

(22) Filed: Sep. 11, 2003

(65) Prior Publication Data

US 2004/0048196 A1 Mar. 11, 2004

Related U.S. Application Data

(63) Continuation of application No. 09/836,832, filed on Apr. 17, 2001, now abandoned.

(51) Int. Cl.$^7$ ............................................... G03C 1/492
(52) U.S. Cl. ................... 430/271.1; 430/325; 430/950; 257/437
(58) Field of Search ............................ 430/950, 271.1, 430/325; 257/437

(56) References Cited

U.S. PATENT DOCUMENTS

| | | |
|---|---|---|
| 5,693,691 A | 12/1997 | Flaim et al. |
| 5,919,599 A | 7/1999 | Meador et al. |
| 6,207,787 B1 | 3/2001 | Fahey et al. |

FOREIGN PATENT DOCUMENTS

| | | |
|---|---|---|
| EP | 0851300 | 7/1998 |
| EP | 0989443 | 3/2000 |
| EP | 0989463 | 3/2000 |

*Primary Examiner*—Rosemary Ashton
(74) *Attorney, Agent, or Firm*—Hovey Williams LLP

(57) ABSTRACT

Anti-reflective compositions and methods of using those compositions to form circuits are provided. The compositions comprise a polymer dissolved or dispersed in a solvent system. In one embodiment, the compositions comprise less than about 0.3% by weight of a strong acid. In another embodiment, the weight ratio of strong acid to weak acid in the composition is from about 0:100 to about 25:75. Examples of preferred weak acid compounds include phenolic compounds (e.g., Bisphenol S, Bisphenol A, α-cyano-4-hydroxycinnamic acid), carboxylic acids (e.g., acetic acid), phosphoric acid, and cyano compounds. The polymer and other ingredients are preferably physically mixed in a solvent system. The resulting compositions are spin bowl compatible (i.e., they do not crosslink prior to the bake stages of the microlithographic processes or during storage at room temperature).

73 Claims, 1 Drawing Sheet

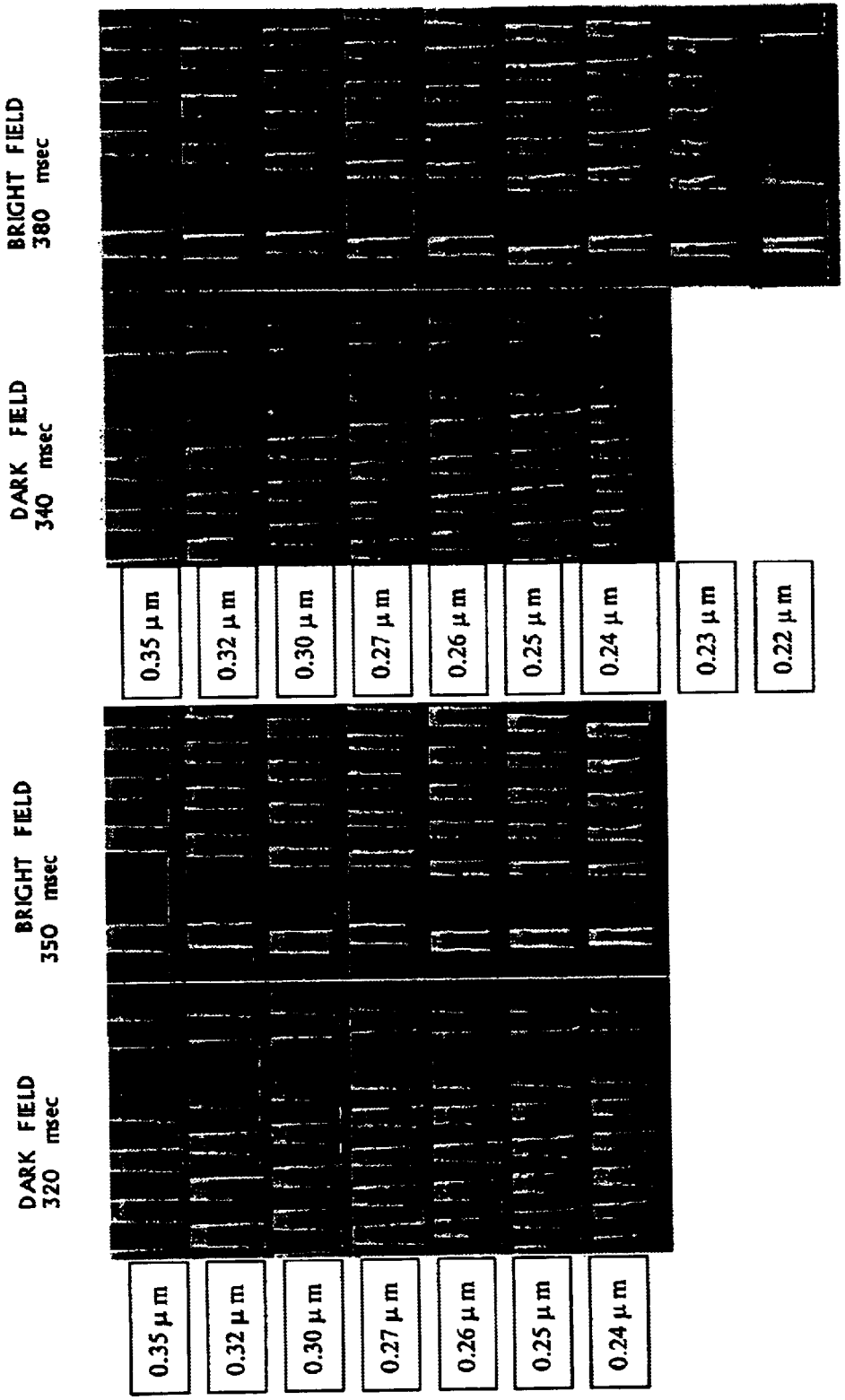

ANTI-REFLECTIVE COATING COMPOSITION WITH IMPROVED SPIN BOWL COMPATIBILITY

RELATED APPLICATIONS

This application is a continuation application of U.S. patent application Ser. No. 09/836,832, filed Apr. 17, 2001, now abandoned incorporated by reference herein.

BACKGROUND OF THE INVENTION

1. Field of the Invention

The present invention is concerned with new anti-reflective compositions for use in the manufacture of microelectronic devices. These compositions include little or no strong acids so that premature crosslinking (e.g., such as during storage) is minimized or prevented.

2. Description of the Prior Art

Integrated circuit manufacturers are consistently seeking to maximize substrate wafer sizes and minimize device feature dimensions in order to improve yield, reduce unit case, and increase on-chip computing power. Device feature sizes on silicon or other chips are now submicron in size with the advent of advanced deep ultraviolet (DUV) and i-line microlithographic processes.

However, a frequent problem encountered by photoresists during the manufacturing of semiconductor devices is that activating radiation is reflected back into the photoresist by the substrate on which it is supported. Such reflectivity tends to cause blurred patterns which degrade the resolution of the photoresist. Degradation of the image in the processed photoresist is particularly problematic when the substrate is highly reflective. One approach to address this problem is the use of an anti-reflective coating applied to the substrate beneath the photoresist layer.

One problem encountered with many prior art anti-reflective coating formulations is that they commonly use a thermal crosslinking system to yield a polymer-containing film which is insoluble in common photoresist solvents. Crosslinking of the anti-reflective coating should only occur during the wafer bake stage, which is usually very short (e.g., 30–90 seconds). However, to generate a crosslinking reaction during such a short bake period, a strong acid catalyst such as p-toluenesulfonic acid has been required. The use of such strong acid catalysts in an anti-reflective coating formulation creates processing problems. That is, a strong acid catalyst not only enables anti-reflective coating crosslinking during the wafer bake stage, but also while the anti-reflective coating material is still in the spin bowl or drain pipes. This crosslinked anti-reflective coating will no longer dissolve in conventional cleaning solvents, thus, the anti-reflective coating material remains and accumulates in the spin bowl and drain pipes. This problem is known as spin bowl incompatibility.

Since spin coating has long been the industry accepted method of coating anti-reflective coatings and photoresists onto wafers, spin bowl incompatibility causes significant process interruptions and down time for wafer processing facilities. Accumulation of the crosslinked anti-reflective coating and precipitation thereof in photoresist solvents can block the spinner drain pipes. This prevents waste material flow and may result in a small pool of waste photoresist collecting in the bottom of the spinner. Since the crosslinked anti-reflective coating cannot be dissolved with solvents, the spinner must be disassembled to clear the drain, thus adding additional time and expense to the process.

Spin bowl incompatibility also causes the crosslinked anti-reflective coating to deposit on the sides of the spin bowl. This "build-up" prevents waste material from flowing smoothly down the sides of the spin bowl and into the drain. Eventually such build-up will be sufficiently present that it will interfere with wafer processing. Again, because the crosslinked anti-reflective coating material cannot be cleaned with solvents, it may be necessary to replace the contaminated spin bowl with a new one. It will be appreciated that this is both time-consuming and costly. Furthermore, because most wafer processing facilities use automated, track-type systems, replacing spin bowls and cleaning drain pipes stop the track and results in downtime for an entire processing operation.

There is a need for new anti-reflective coatings which are spin bowl compatible and have improved stability at room temperature while simultaneously exhibiting the desired performance characteristics of DUV, and i-line, and 193 nm anti-reflective coating materials.

SUMMARY OF THE INVENTION

The present invention overcomes the spin bowl incompatibility and stability problems of the prior art anti-reflective coatings by broadly providing anti-reflective coating compositions that do not crosslink prior to the bake stages of the microlithographic processes.

In more detail, the compositions comprise at least one polymer dispersed or dissolved in a solvent system. The compositions should comprise from about 0.5–10% by weight polymer, preferably from about 1–5% by weight polymer, and more preferably from about 1.1–2.5% by weight polymer, based upon the total weight of the composition taken as 100% by weight. The weight average molecular weight of the polymer is from about 3000–500,000 Daltons, preferably from about 50,000–500,000, and more preferably from about 55,000–75,000 Daltons. The most preferred polymers are those selected from the group consisting of acrylic polymers (e.g., methacrylates such as benzyl methacrylate, polyglycidylmethacrylate, and hydroxypropyl methacrylate), polyesters, epoxy novolaks, polysaccharides, polyethers, polyimides, and mixtures thereof.

In one embodiment, the compositions comprise less than about 1.0% by weight of a strong acid, preferably less than about 0.3% by weight of a strong acid, more preferably less than about 0.1% by weight of a strong acid, and even more preferably about 0% by weight of a strong acid, based upon the total weight of the composition taken as 100% by weight. In this embodiment, it is particularly preferred that the polymer utilized has a high weight average molecular weight (e.g., at least about 60,000). As used herein, the term "strong acid" is intended to refer to those compounds having a $pK_a$ of less than about −6.0 at 25° C. Examples of strong acids include p-toluenesulfonic acid, sulfuric acid, hydrochloric acid, hydrobromic acid, nitric acid, trifluoroacetic acid, and perchloric acid.

In another embodiment, the weight ratio of strong acid to weak acid in the composition is from about 0:100 to about 50:50, preferably from about 25:75 to about 30:70, and more preferably about 2:98. As used herein, the term "weak acid" is intended to refer to those compounds having a $pK_a$ of greater than about 0, preferably from about 0–12, and more preferably from about 6–11 at 25° C.

Preferred examples of weak acids as used herein include phenolic compounds (including any phenolic compounds containing electron withdrawing groups, e.g., bis(4- hydroxyphenyl) sulfone or bisphenol S, bis(4-hydroxyphenyl) dimethylmethane or bisphenol A, α-cyano-4-hydroxycinnamic acid, phenol novolaks, benzenthiol, and phenols substituted with nitro groups, carbonyl groups, or carboxylic groups), carboxylic acids (e.g., acetic acid), and phosphoric acid. These compounds are preferably present in the composition at a level of from about 0.02–5% by weight, more preferably from about 0.05–4% by weight, and even more preferably from about 1.5–3.3% by weight, based upon the total weight of the composition taken as 100% by weight.

These weak acid compounds can be physically mixed into the composition or they can be grafted onto or chemically bonded with a polymer present in the composition. It will be appreciated that these compounds provide the composition with the ability to absorb light while also acting as a catalyst to initiate crosslinking during the bake stages of the microlithographic processes.

The compositions are formed by conventional processes. That is, the polymer and other ingredients are mixed with a suitable solvent system, preferably at ambient conditions and for a sufficient amount of time to form a substantially homogeneous solution. Preferred solvent systems include a solvent selected from the group consisting of propylene glycol methyl ether acetate (PGMEA), propylene glycol methyl ether (PGME), propylene glycol n-propyl ether, 2-heptanone, N-methylpyrollidinone, ethyl lactate, cyclohexanone, ethylene glycol monomethyl ether, ethylene glycol monoethyl ether, and mixtures thereof. The solvent system should be utilized at a level of from about 85–99% by weight, and preferably from about 93–97% by weight, based upon the total weight of the composition taken as 100% by weight.

Preferably, the inventive compositions further comprise a crosslinking agent and a catalyst. The crosslinking agent can be separate from the polymer or, alternately, the polymer can include "built-in" crosslinking moieties. Preferred crosslinking agents include aminoplasts (e.g., Powderlink® 1174, Cymel® 303LF) and epoxies. The crosslinking agent or moieties should be present in the composition at a level of from about 0.2–5% by weight, and preferably from about 0.5–0.95% by weight, based upon the total weight of the composition taken as 100% by weight. The compositions of the invention should be crosslinked at a temperature of from about 100–300° C., and more preferably from about 150–250° C.

It will be appreciated that a number of other optional ingredients can be incorporated into the inventive anti-reflective compositions. An example of one such ingredient includes a surfactant, with preferred surfactants being those selected from the group consisting of fluorinated surfactants and carbonated surfactants. If a surfactant is included, it should be present at a level of from about 0.02–5% by weight, and preferably from about 0.05–1% by weight, based upon the total weight of the composition taken as 100% by weight.

Furthermore, an additional light attenuating compound can be added to the composition if desired. Suitable light attenuating compounds include benzene, naphthalene, anthracene, and substituted derivatives of the foregoing.

The resulting anti-reflective coating composition is subsequently applied to the surface of a substrate (e.g., silicon wafer) by conventional methods, such as by spincoating, to form an anti-reflective coating layer on the substrate. The substrate is then baked at temperatures of from about 125–225° C. The baked layer will generally have a thickness of anywhere from about 600 Å to about 2200 Å. Next, a photoresist can be applied to the anti-reflective layer followed by exposing the photoresist to light at the desired wavelength, developing the exposed photoresist layer, and etching the developed photoresist layer all according to known procedures.

At 365 nm the inventive anti-reflective coating layers have a k value (i.e., the imaginary component of the complex index of refraction) of at least about 0.3, and preferably at least about 0.35, and have an n value (i.e., the real component of the complex index of refraction) of at least about 1.5, and preferably at least about 1.75. That is, a cured layer formed from the inventive composition will absorb at least about 70%, and preferably at least about 90% of light at a wavelength of 365 nm.

Furthermore, the inventive anti-reflective coatings will be substantially insoluble in typical photoresist solvents (e.g., ethyl lactate). That is, when subjected to a stripping test, the inventive anti-reflective coating layers will have a stripping amount of less than about 50 Å, and preferably less than about 25 Å. The stripping test involves puddling a solvent (e.g., ethyl lactate) onto the cured film for 5–10 seconds, followed by spin drying at 2000 rpm for 30 seconds to remove the solvent. The film thickness is measured at multiple points on the wafer using ellipsometry. The amount of stripping is determined to be the difference between the initial and final average film thicknesses.

Finally, when the inventive anti-reflective coating compositions are subjected to a spin bowl compatibility test as defined in Example 5, they will achieve a result of at least about 90%, and preferably at least about 95%. It will be appreciated that this results in an effective anti-reflective coating composition that will not crosslink prematurely (e.g., such as in the spin bowl or drain pipes) and has a longer shelf life (won't crosslink during storage), but will substantially or completely crosslink during the bake stage.

BRIEF DESCRIPTION OF THE DRAWINGS

FIG. 1 is a scanning electron microscope (SEM) photograph depicting an anti-reflective coating composition according to the invention deposited on silicon wafers; and FIG. 2 is another SEM photograph depicting an anti-reflective coating composition according to the invention deposited on silicon wafers.

DETAILED DESCRIPTION OF THE PREFERRED EMBODIMENTS

EXAMPLES

The following examples set forth preferred methods in accordance with the invention. It is to be understood, however, that these examples are provided by way of illustration and nothing therein should be taken as a limitation upon the overall scope of the invention.

Example 1

Comparative Example (Control)

An anti-reflective coating was prepared according to prior art procedures in order to provide a control standard for spin bowl compatibility tests. A mixture containing the following ingredients was prepared: 11.60% by weight polymer solids (50% by weight benzyl methacrylate and 50% by weight hydroxypropyl methacrylate); 0.58% by weight of Powderlink® 1174 (a crosslinking agent obtained from Cytec);

0.1% by weight p-toluenesulfonic acid (pTSA); 9.69% by weight propylene glycol monomethyl ether acetate (PGMEA); 77.96% by weight propylene glycol monomethyl ether (PGME); and 0.07% by weight surfactant (FC-171, obtained from 3M). The mixture was stirred for one hour to yield a clear solution followed by ion exchange with 650C beads. The formulation was then filtered through a 1×0.2 μm absolute filter and a 2×0.1 μm absolute filter. The filtered material was spincoated onto a silicon wafer at a speed of 2500 rpm for 60 seconds followed by baking at 175° C. for one minute. The resulting anti-reflective film had a thickness of about 880 Å. The absorbance of the film was as follows: about 9.06/μm at a wavelength of 193 nm; about 0.09/μm at a wavelength of 248 nm; and about 0.038 μm at a wavelength of about 365 nm.

Example 2

Preparation of an Anti-Reflective Coating According to the Invention

A mixture of the following ingredients was prepared: 11.60% by weight polymer solids (50% benzyl methacrylate and 50% hydroxypropyl methacrylate); 0.58% by weight Powderlink 1174; 0.075% by weight Bisphenol S (obtained from Aldrich); 0.025% by weight pTSA; 9.69% by weight PGMEA; 77.96% PGME; and 0.07% by weight FC-171 surfactant. The mixture was stirred for one hour to yield a clear solution followed by ion exchange with 650C beads. The formulation was then filtered through a 1×0.2 μm absolute filter and a 2×0.1 μm absolute filter. The filtered formulation was spincoated onto a silicon wafer at a speed of 2500 rpm for 60 seconds followed by baking at 175° C. for one minute. The resulting anti-reflective film had a thickness of about 880 Å. The absorbance of the film was as follows: about 13.66/μm at a wavelength of 193 nm; about 0.54/μm at a wavelength of 248 nm; and about 0.10/μm at a wavelength of about 365 nm.

Example 3

Preparation of an Anti-Reflective Coating According to the Invention

An anti-reflective coating was prepared following the procedure described above in Example 2, but with 0.1% by weight Bisphenol S being used in place of 0.075% by weight Bisphenol S and 0.025% by weight pTSA.

Example 4

Preparation of an Anti-Reflective Coating According to the Invention

An anti-reflective coating was prepared following the procedure described above in Example 2, but with substituting 0.1% by weight phenol novolak in place of 0.075% by weight Bisphenol S and 0.025% by weight pTSA.

Example 5

Spin Bowl Compatibility Test Procedure

In this test, four-inch sample wafers were individually coated with the anti-reflective coating compositions prepared in Examples 1–4 above. One sample wafer was prepared for each solvent to be tested. After coating, the wafers were not baked, but were instead placed in a wafer cassette. The coated surfaces were positioned upward in order to prevent film flow, and the samples were allowed to dry for about 24 hours in a cleanroom to yield films around 1300 Å thick. The sample thickness was measured on each wafer and was designated as the initial sample thickness.

The coated wafer was then exposed to the particular test solvent. This was accomplished by centering a sample wafer on a spinner, followed by coating with the solvent evenly over the entire surface of the wafer. The sample was allowed to soak for three minutes (±five seconds) followed by spinning for 15 seconds at 1500 rpm (20,000 rpm Ramp) and then for 30 seconds at 2500 rpm (20,000 rpm Ramp). After spinning, the wafer was baked at 100° C. for 30 seconds. The thickness of the sample on the wafer was measured and designated as the final thickness. This procedure was repeated for each solvent to be tested.

The percent solubility was then calculated as follows:

$$\% \text{ solubility} = \left[\frac{(\text{initial sample thickness} - \text{final sample thickness})}{(\text{initial sample thickness})}\right] * 100.$$

If the percent solubility of the tested wafer was ≧90%, then the sample was deemed to be spin bowl compatible for that particular solvent. However, if the percent solubility was <90%, then that sample was not considered to be spin bowl compatible for that solvent. The results from these tests are depicted in Table 1.

TABLE 1

Spin Bowl Compatibility Test Results

| Formulation | Solvent | Thickness before strip, Å | Thickness after strip, Å | % loss | Spin Bowl Compatible |
|---|---|---|---|---|---|
| Example 1 (control) | PGME | 1410 | 1270 | 9.93 | No |
|  | Ethyl lactate | 1367 | 1273 | 6.88 | No |
|  | Cyclohexanone | 1372 | 1291 | 5.9 | No |
|  | Acetone | 1373 | 1274 | 7.21 | No |
|  | PGMEA | 1382 | 1398 | −1.16 | No |
| Example 2 | PGME | 1207 | 39 | 96.6 | Yes |
|  | Ethyl lactate | 1220 | 67 | 94.5 | Yes |
|  | Cyclohexanone | 1234 | 85 | 93.11 | Yes |
|  | Acetone | 1229 | 43 | 96.5 | Yes |
|  | PGMEA | 1234 | 42 | 96.6 | Yes |
| Example 3 | PGME | 1105 | 46 | 95.83 | Yes |
|  | Ethyl lactate | 1086 | 40 | 96.32 | Yes |
|  | Cyclohexanone | 1089 | 56 | 94.85 | Yes |
|  | Acetone | 1089 | 62 | 94.85 | Yes |
|  | PGMEA | — | — | — | — |
| Example 4 | PGME | 1079 | 42 | 96.1 | Yes |
|  | Ethyl lactate | 1071 | 22 | 97.94 | Yes |
|  | Cyclohexanone | 1059 | 37 | 96.5 | Yes |
|  | Acetone | 1075 | 65 | 93.95 | Yes |
|  | PGMEA | — | — | — | — |

Example 6

Preparation of an Anti-Reflective Coating According to the Invention

In this example, 20 g of glycidylmethacrylate was reacted with 0.25 g of azobisisobutyronitrile in 81 g of PGMEA under nitrogen atmosphere at 75° C. for 24 hours to yield polyglycidylmethacrylate polymer. Next, α-cyano-4-hydroxycinnamic acid dye (see Scheme A) was grafted to the epoxy functionality of polyglycidylmethacrylate poly mer (20% solids in PGMEA) in the presence of benzyltriethyl ammonium chloride (BTEAC) catalyst. The grafting reaction was carried out by dissolving the ingredients in a solvent system comprising ethyl lactate and PGMEA at a weight ratio of 75:25 (ethyl lactate:PGMEA). The dye dissolved in the solution at approximately 90° C. The reaction was carried out at 120° C. for 4–5 hours in a nitrogen atmosphere. The amounts of the ingredients used are set forth in Table 2.

Scheme A

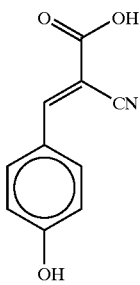

TABLE 2

| INGREDIENT | QUANTITY |
|---|---|
| polyglycidylmethacrylate polymer | 20.00 g solids in PGMEA |
| α-cyano-4-hydroxycinnamic acid dye | 26.30 g |
| BTEAC | 0.20 g |
| PGMEA | 154.45 g |
| ethyl lactate | 464.34 g |

After the grafting reaction was complete, the dye-grafted polymer (mother liquor, see Scheme B) was formulated into an anti-reflective coating composition. This was accomplished through the addition of a melamine crosslinker and the appropriate amounts of solvents to achieve the desired film thickness upon baking at elevated temperatures. Table 3 sets forth the amounts of the ingredients in the anti-reflective coating composition.

Scheme B

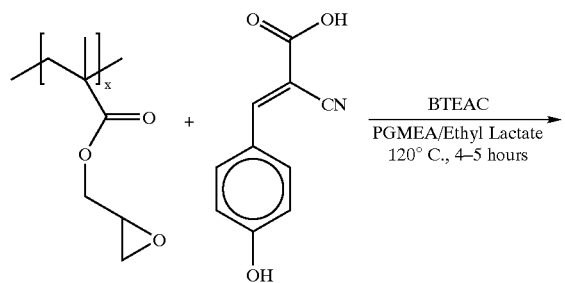

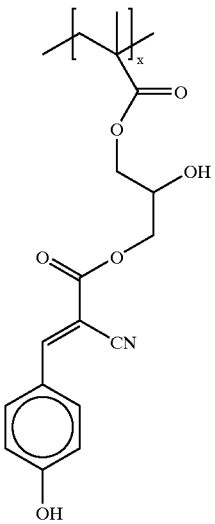

TABLE 3

| INGREDIENT | QUANTITY |
|---|---|
| mother liquor | 250.00 g |
| melamine crosslinker[a] | 3.44 g |
| PGMEA | 31.85 g |
| ethyl lactate | 95.54 g |

[a]sold under the name Cymel ® 303 LF, obtained from Cytec.

This formulation was spincoated onto silicon wafers at 2500 rpm for 60 seconds followed by baking on a hotplate at temperatures ranging from 120° C. to 205° C. The film thickness was measured using standard ellipsometric methods. The film was then exposed to an organic solvent (i.e., ethyl lactate) which is commonly used in semiconductor manufacturing processes. The anti-reflective film did not exhibit any appreciable film thickness loss, thus indicating that the crosslinking reaction had occurred. Crosslinking resulted because of the acidity imparted by the hydroxy group of the dye, thus yielding an inert, thermoset polymer film that is also spin bowl compatible.

A photoresist composition (PFI-88, obtained from Sumitomo Chemical Co.) was applied to the cured anti-reflective layer by spincoating of at 3000 rpm for 60 seconds followed by baking at 90° C. for 60 seconds. All wafers were coated and developed on a DNS 80B. Exposures were carried out with a Nikon NSR at 365 nm for 360 msec. The photoresist was then baked at 110° C. for 60 seconds and developed with CD26 developer (obtained from Shipley Company). FIG. 1 shows the cross-sections of several different wafers at varying feature sizes.

This novel anti-reflective coating composition exhibited the same lithographic performance with commercial i-line photoresists as those containing an acid catalyst. The photoresist profiles of the non-acid anti-reflective coating compositions did not show any intermixing with the photoresist, thus confirming that the film was crosslinked into thermoset.

Example 7

Preparation of an Anti-Reflective Coating According to the Invention

An anti-reflective coating was prepared following the procedure described in Example 6, with the quantities of ingredients used being set forth in Table 4.

TABLE 4

| INGREDIENT | QUANTITY |
|---|---|
| mother liquor[a] | 250.00 g |
| melamine crosslinker[b] | 2.97 g |
| strong acid[c] | 0.15 g |
| PGMEA | 30.46 g |
| ethyl lactate | 91.37 g |

[a]See Table 2 of Example 6.
[b]Cymel ® 303LF.
[c]p-toluenesulfonic acid monohydrate obtained from Sigma-Aldrich.

Wafers were coated with the anti-reflective composition and a photoresist and were processed as described in Example 6. FIG. 2 shows the cross-sections of several different wafers at varying feature sizes.

Example 8

Spin Bowl Compatibility Test

The anti-reflective coatings prepared in Examples 6 and 7 were subjected to the spin bowl compatibility test procedure described in Example 5. The results from these tests are set forth in Table 5.

TABLE 5

Spin Bowl Compatibility Test Results

| Formulation | Solvent | Thickness before strip, Å | Thickness after strip, Å | % loss | Spin Bowl Compatible |
|---|---|---|---|---|---|
| Example 6 | PGME | 3574 | 87 | 98 | Yes |
|  | Ethyl lactate | 3543 | 110 | 97 | Yes |
|  | Cyclohexanone | 3368 | 116 | 97 | Yes |
|  | Acetone | 3455 | 131 | 96 | Yes |
|  | PGMEA | 3526 | 99 | 97 | Yes |
| Example 7 | PGME | 2628 | 105 | 96 | Yes |
|  | Ethyl lactate | 2619 | 146 | 94 | Yes |
|  | Cyclohexanone | 2628 | 114 | 96 | Yes |
|  | Acetone | 2627 | 195 | 93 | Yes |
|  | PGMEA | 2630 | 124 | 95 | Yes |

We claim:

1. In an anti-reflective coating composition for use during microlithographic processes, said composition comprising a polymer dissolved in a solvent system, the improvement being that said composition comprises less than about 0.3% by weight of a strong acid and gives a spin bowl compatibility test result of greater than about 90% when propylene glycol methyl ether is used in the spin bowl compatibility test.

2. The composition of claim 1, said composition further comprising a compound selected from the group consisting of phenolic compounds, carboxylic acids, phosphoric acid, and cyano compounds.

3. The composition of claim 2, wherein said compound is chemically bonded with said polymer.

4. The composition of claim 2, wherein said compound is selected from the group consisting of Bisphenol S, Bisphenol A, α-cyano-4-hydroxycinnamic acid, phenol novolaks, and acetic acid.

5. The composition of claim 1, wherein said composition comprises a compound selected from the group consisting of surfactants, crosslinking agents, and mixtures thereof.

6. The composition of claim 5, wherein said surfactant is selected from the group consisting of fluorinated surfactants and carbonated surfactants.

7. The composition of claim 5, wherein said crosslinking agent is selected from the group consisting of aminoplasts and epoxies.

8. The composition of claim 1, wherein said solvent system includes a solvent selected from the group consisting of PGMEA, PGME, propylene glycol n-propyl ether, 2-heptanone, N-methylpyrollidinone, ethyl lactate, cyclohexanone, ethylene glycol monomethyl ether, ethylene glycol monoethyl ether, and mixtures thereof.

9. The composition of claim 1, wherein said polymer is selected from the group consisting of acrylic polymers, polyesters, epoxy novolaks, polysaccharides, polyethers, polyimides, and mixtures thereof.

10. The composition of claim 9, wherein said polymer is a methacrylate.

11. In an anti-reflective coating composition for use during microlithographic processes, said composition comprising a polymer dissolved in a solvent system and having a weight ratio of strong acid to weak acid, the improvement being that the weight ratio is from about 0:100 to about 50:50.

12. The composition of claim 11, said composition further comprising a compound selected from the group consisting of phenolic compounds, carboxylic acids, phosphoric acid, and cyano compounds.

13. The composition of claim 12, wherein said compound is chemically bonded with said polymer.

14. The composition of claim 12, wherein said compound is selected from the group consisting of Bisphenol S, Bisphenol A, α-cyano-4-hydroxycinnamic acid, phenol novolaks, and acetic acid.

15. The composition of claim 11, wherein said composition comprises a compound selected from the group consisting of surfactants, crosslinking agents, and mixtures thereof.

16. The composition of claim 15, wherein said surfactant is selected from the group consisting of fluorinated surfactants and carbonated surfactants.

17. The composition of claim 15, wherein said crosslinking agent is selected from the group consisting of aminoplasts and epoxies.

18. The composition of claim 11, wherein said solvent system includes a solvent selected from the group consisting of PGMEA, PGME, propylene glycol n-propyl ether, 2-heptanone, N-methylpyrollidinone, ethyl lactate, cyclohexanone, ethylene glycol monomethyl ether, ethylene glycol monoethyl ether, and mixtures thereof.

19. The composition of claim 11, wherein said polymer is selected from the group consisting of acrylic polymers, polyesters, epoxy novolaks, polysaccharides, polyethers, polyimides, and mixtures thereof.

20. The composition of claim 19, wherein said polymer is a methacrylate.

21. The composition of claim 11, wherein said composition gives a spin bowl compatibility test result of greater than about 90%.

22. The composition of claim 11, wherein said composition comprises less than about 03% by weight of a strong acid.

23. In an anti-reflective coating composition for use during microlithographic processes, said composition comprising a polymer dissolved in a solvent system, the improvement being that said composition comprises a non-polymeric compound selected from the group consisting of Bisphenol A and α-cyano-4-hydroxycinnamic acid.

24. The composition of claim 23, wherein said composition gives a spin bowl compatibility test result of greater than about 90%.

25. The composition of claim 23, wherein said composition comprises less than about 0.3% by weight of a strong acid.

26. The composition of claim 23, said composition having a weight ratio of strong acid to weak acid of from about 0:100 to about 50:50.

27. The composition of claim 23, wherein said compound is chemically bonded with said polymer.

28. The combination of a substrate having a surface and a cured protective layer on said substrate surface, said cured protective layer being formed from a composition comprising a polymer dissolved in a solvent system and less than about 0.3% by weight of a strong acid, said composition giving a spin bowl compatibility test result of greater than about 90% when propylene glycol methyl ether is used in the spin bowl compatibility test.

29. The combination of claim 28, said composition further comprising a compound selected from the group consisting of phenolic compounds, carboxylic acids, phosphoric acid, and cyano compounds.

30. The combination of claim 29, wherein said compound is chemically bonded with said polymer.

31. The combination of claim 29, wherein said compound is selected from the group consisting of Bisphenol S, Bisphenol A, α-cyano-4-hydroxycinnamic acid, phenol novolaks, and acetic acid.

32. The combination of claim 28, wherein said composition comprises a compound selected from the group consisting of surfactants, crosslinking agents, and mixtures thereof.

33. The combination of claim 28, wherein said polymer is selected from the group consisting of acrylic polymers, polyesters, epoxy novolaks, polysaccharides, polyethers, polyimides, and mixtures thereof.

34. The combination of claim 33, wherein said polymer is a methacrylate.

35. The combination of a substrate having a surface and a cured protective layer on said substrate surface, said cured protective layer being formed from a composition comprising a polymer dissolved in a solvent system, the weight ratio of strong acid to weak acid in said composition being from about 0:100 to about 50:50.

36. The combination of claim 35, said composition further comprising a compound selected from the group consisting of phenolic compounds, carboxylic acids, phosphoric acid, and cyano compounds.

37. The combination of claim 36, wherein said compound is chemically bonded with said polymer.

38. The combination of claim 36, wherein said compound is selected from the group consisting of Bisphenol S, Bisphenol A, α-cyano-4-hydroxycinnamic acid, phenol novolaks, and acetic acid.

39. The combination of claim 35, wherein said composition comprises a compound selected from the group consisting of surfactants, crosslinking agents, and mixtures thereof.

40. The combination of claim 35, wherein said polymer is selected from the group consisting of acrylic polymers, polyesters, epoxy novolaks, polysaccharides, polyethers, polyimides, and mixtures thereof.

41. The combination of claim 40, wherein said polymer is a methacrylate.

42. The combination of claim 35, wherein said composition gives a spin bowl compatibility test result of greater than about 90%.

43. The combination of claim 35, wherein said composition comprises less than about 0.3% by weight of a strong acid.

44. The combination of a substrate having a surface and a cured protective layer on said substrate surface, said cured protective layer being formed from a composition comprising a polymer dissolved in a solvent system and a non-polymeric compound selected from the group consisting of Bisphenol A and α-cyano-4-hydroxycinnamic acid.

45. The combination of claim 44, wherein said composition gives a spin bowl compatibility test result of greater than about 90%.

46. The combination of claim 44, wherein said composition comprises less than about 0.3% by weight of a strong acid.

47. The combination of claim 44, said composition having a weight ratio of strong acid to weak acid of from about 0:100 to about 50:50.

48. The combination of claim 44, wherein said compound is chemically bonded with said polymer.

49. A method of forming a precursor structure for use in manufacturing integrated circuits, said method comprising the step of applying a quantity of an anti-reflective composition according to claim 1 to the surface of a substrate to form an anti-reflective layer on said substrate surface.

50. The method of claim 49, wherein said applying step comprises spincoating said composition on said substrate surface.

51. The method of claim 49, further including the step of baking said anti-reflective layer after said applying step at a temperature of from about 125–225° C.

52. The method of claim 51, further including the step of applying a photoresist to said baked anti-reflective layer.

53. The method of claim 52, furthering including the steps of:
exposing at least a portion of said photoresist layer to activating radiation;
developing said exposed photoresist layer; and
etching said developed photoresist layer.

54. A method of forming a precursor structure for use in manufacturing integrated circuits, said method comprising the step of applying a quantity of an anti-reflective composition according to claim 11 to the surface of a substrate to form an anti-reflective layer on said substrate surface.

55. The method of claim 54, further including the step of baking said anti-reflective layer alter said applying step at a temperature of from about 125–2250° C.

56. The method of claim 55, further including the step of applying a photoresist to said baked anti-reflective layer.

57. The method of claim 56, furthering including the steps of:
exposing at least a portion of said photoresist layer to activating radiation;
developing said exposed photoresist layer; and
etching said developed photoresist layer.

58. A method of forming a precursor structure for use in manufacturing integrated circuits, said method comprising the step of applying a quantity of an anti-reflective composition according to claim 23 to the surface of a substrate to form an anti-reflective layer on said substrate surface.

59. The method of claim 58, further including the step of baking said anti-reflective layer after said applying step at a temperature of from about 125–2250° C.

60. The method of claim 59, further including the step of applying a photoresist to said baked anti-reflective layer.

61. The method of claim 60, furthering including the steps of:

exposing at least a portion of said photoresist layer to activating radiation;

developing said exposed photoresist layer; and etching said developed photoresist layer.

62. In an anti-reflective coating composition for use during microlithographic processes, said composition comprising a polymer dissolved in a solvent system, the improvement being that said composition comprises less than about 0.3% by weight of a strong acid and from about 0.02–5% by weight of a weak acid.

63. The composition of claim 62, wherein said composition gives a spin bowl compatibility test result of greater than about 90%.

64. The combination of a substrate having a surface and a cured protective layer on said substrate surface, said cured protective layer being formed from a composition comprising:

a polymer dissolved in a solvent system;

less than about 0.3% by weight of a strong acid; and from about 0.02–5% by weight of a weak acid.

65. The composition of claim 64, wherein said composition gives a spin bowl compatibility test result of greater than about 90%.

66. A method of forming a precursor structure for use in manufacturing integrated circuits, said method comprising the step of applying a quantity of an anti-reflective composition according to claim 62 to the surface of a substrate to form an anti-reflective layer on said substrate surface.

67. The method of claim 66, further including the step of baking said anti-reflective layer after said applying step at a temperature of from about 125–2250° C.

68. The method of claim 67, further including the step of applying a photoresist to said baked anti-reflective layer.

69. The method of claim 68, furthering including the steps of:

exposing at least a portion of said photoresist layer to activating radiation;

developing said exposed photoresist layer; and etching said developed photoresist layer.

70. In an anti-reflective coating composition for use during microlithographic processes, said composition comprising a polymer dissolved in a solvent system, the improvement being that said composition comprises a compound selected from the group consisting of Bisphenol A and α-cyano-4-hydroxycinnamic acid, and said composition gives a spin bowl compatibility test result of greater than about 90%.

71. In an anti-reflective coating composition for use during microlithographic processes, said composition comprising a polymer dissolved in a solvent system, the improvement being that said composition comprises a compound selected from the group consisting of Bisphenol A and α-cyano-4 -hydroxycinnamic acid, and said composition has a weight ratio of strong acid to weak acid of from about 0:100 to about 50:50.

72. The combination of a substrate having a surface and a cured protective layer on said substrate surface, said cured protective layer being formed from a composition comprising a polymer dissolved in a solvent system and a compound selected from the group consisting of Bisphenol A and α-cyano-4-hydroxycinnamic acid, said composition giving a spin bowl compatibility test result of greater than about 90%.

73. The combination of a substrate having a surface and a cured protective layer on said substrate surface, said cured protective layer being formed from a composition comprising a polymer dissolved in a solvent system and a compound selected from the group consisting of Bisphenol A and α-cyano4-hydroxycinnamic acid, said composition having a weight ratio of strong acid to weak acid of from about 0:100 to about 50:50.

\* \* \* \* \*